(12) United States Patent
Na et al.

(10) Patent No.: US 11,714,466 B2
(45) Date of Patent: Aug. 1, 2023

(54) DISPLAY DEVICE

(71) Applicant: Samsung Display Co., LTD., Yongin-si (KR)

(72) Inventors: Yeon-Sun Na, Yongin-si (KR); Min-Soo Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/985,984

(22) Filed: Nov. 14, 2022

(65) Prior Publication Data

US 2023/0079534 A1 Mar. 16, 2023

Related U.S. Application Data

(63) Continuation of application No. 17/013,898, filed on Sep. 8, 2020, now Pat. No. 11,520,384.

(30) Foreign Application Priority Data

Mar. 4, 2020 (KR) .................. 10-2020-0027044

(51) Int. Cl.
*G06F 1/18* (2006.01)
*G06F 1/20* (2006.01)
(Continued)

(52) U.S. Cl.
CPC .......... *G06F 1/189* (2013.01); *G02F 1/13458* (2013.01); *G06F 1/20* (2013.01);
(Continued)

(58) Field of Classification Search
CPC ........ G06F 1/189; G06F 1/20; G02F 1/13458; G09G 3/20; G09G 2310/0275; H05K 1/0209; H05K 7/20963; H05K 1/147
See application file for complete search history.

(56) References Cited

U.S. PATENT DOCUMENTS 7,599,193 B2 10/2009 Park et al.
2008/0137020 A1 6/2008 Takahashi et al.
(Continued)

FOREIGN PATENT DOCUMENTS

EP 2725881 4/2014
JP 2000276071 A 10/2000
(Continued)

OTHER PUBLICATIONS

Hayashi Katsuhiko; Kataoka Tatsuo, "Flexible Printed Wiring Board and Semiconductor Device Employing the Same", Oct. 8, 2010, Mitsui Mining & Smelting Co, Entire Document (Translation of KR 20100109524) (Year: 2010).*

*Primary Examiner* — Stephen S Sul
(74) *Attorney, Agent, or Firm* — Cantor Colburn LLP

(57) ABSTRACT

A display device includes a display panel, a data driver which transmits a data voltage to the display panel, a first flexible printed circuit board attached to the display panel and including an input side wiring electrically connected to the data driver, a first printed circuit board (PCB) electrically connected to the input side wiring to transmit a high-speed driving signal to the data driver, and a metal tape overlapping the input side wiring in a plan view and attached on the first flexible printed circuit board, where a part of the metal tape overlapping the input side wiring in the plan view defines an opening.

20 Claims, 26 Drawing Sheets

(51) Int. Cl.
  *G09G 3/20*    (2006.01)
  *H05K 7/20*    (2006.01)
  *H05K 1/02*    (2006.01)
  *G02F 1/1345*  (2006.01)
  *H05K 1/14*    (2006.01)

(52) U.S. Cl.
  CPC ............. *G09G 3/20* (2013.01); *H05K 1/0209* (2013.01); *H05K 7/20963* (2013.01); *G09G 2310/0275* (2013.01); *H05K 1/147* (2013.01)

(56) References Cited

U.S. PATENT DOCUMENTS

| | | |
|---|---|---|
| 2008/0310091 A1 | 12/2008 | Im |
| 2009/0141209 A1* | 6/2009 | Chen .................... G02F 1/1336 349/58 |
| 2010/0201900 A1 | 8/2010 | Lee et al. |
| 2010/0314637 A1* | 12/2010 | Kim .................... H01L 23/3737 257/E23.101 |
| 2011/0063261 A1 | 3/2011 | Park et al. |
| 2011/0193478 A1 | 8/2011 | Kim |
| 2012/0075268 A1 | 3/2012 | Chung et al. |
| 2013/0141664 A1 | 6/2013 | Toyoyama |
| 2013/0162506 A1 | 6/2013 | Kim et al. |
| 2014/0055328 A1 | 2/2014 | Osako |
| 2014/0118969 A1 | 5/2014 | Lee |
| 2015/0230337 A1 | 8/2015 | Kim et al. |
| 2016/0180756 A1 | 6/2016 | Go et al. |
| 2016/0306213 A1 | 10/2016 | Lee |
| 2017/0238421 A1 | 8/2017 | Hwang et al. |
| 2020/0196496 A1 | 6/2020 | Shin |

FOREIGN PATENT DOCUMENTS

| | | | | |
|---|---|---|---|---|
| JP | 2010113263 | 5/2010 | | |
| JP | 201971401 A | 5/2019 | | |
| KR | 20100109524 A | * 10/2010 | ............... | H05K 1/09 |
| KR | 101558418 B1 | 10/2015 | | |
| KR | 1020190012023 A | 2/2019 | | |
| KR | 1020190046435 A | 5/2019 | | |

* cited by examiner

DISPLAY DEVICE

This application is a continuation of U.S. patent application Ser. No. 17/013,898, filed on Sep. 8, 2020, which claims priority to Korean Patent Application No. 10-2020-0027044, filed on Mar. 4, 2020, and all the benefits accruing therefrom under 35 U.S.C. § 119, the content of which in its entirety is herein incorporated by reference.

BACKGROUND

1. Field

The present disclosure relates to a display device, and in detail relates to a driving chip for a display device and a tape covering peripheral wiring thereof.

2. Description of the Related Art

A display device of various types is used, and typically, this may be a liquid crystal display or an organic light emitting device.

The liquid crystal display includes a backlight unit, and is a display device that blocks or transmits light emitted from the backlight unit to display an image.

The organic light emitting device is a display device that has a self-luminous characteristic, and unlike a liquid crystal display, does not require a separate light source.

The display device is manufactured in various sizes, where a small display device is representatively used for a mobile phone, and a television and a monitor are typical examples of a large display device.

The size of the large display device is getting very large. The largest display device that was previously sold is 50 inches, but more than a 70-inch display device is currently sold, and a very large display device of 100 inches is also on the market.

Such a display device is driven through a driving chip, and the driving chip receives signals through a high-speed signal wire, converts the signal, and outputs the converted signal to a display panel.

SUMMARY

Exemplary embodiments provide a display device for improving transmission performance by considering an impedance characteristic on signals transmitted to a driving chip.

A display device according to an exemplary embodiment includes a display panel; a data driver which transmits a data voltage to the display panel; a first flexible printed circuit board attached to the display panel and including an input side wiring electrically connected to the data driver; a first printed circuit board ("PCB") electrically connected to the input side wiring to transmit a high-speed driving signal to the data driver; and a metal tape overlapping the input side wiring in a plan view and attached on the first flexible printed circuit board, where a part of the metal tape overlapping the input side wiring in the plan view defines an opening.

The opening may be defined in a wiring overlapping part of the metal tape where the metal tape overlaps the input side wiring.

The wiring overlapping part may extend from the data driver toward an input side pad disposed at an end of the input side wiring.

The metal tape may further include a heat discharge part covering the data driver.

The metal tape may further include an adhesion part which helps attachment on the first flexible printed circuit board.

A width of the heat discharge part and a width of the adhesion part may be different from each other.

The width of the heat discharge part and the width of the adhesion part may be the same.

The metal tape may have a plate structure.

The opening may be provided in plural, and the wiring overlapping part may further include a linear structure disposed along an outer periphery of the wiring overlapping part.

A display device according to an exemplary embodiment includes a display panel; a data driver which transmits a data voltage to the display panel; a first flexible printed circuit board attached to the display panel and including an input side wiring electrically connected to the data driver; a first printed circuit board (PCB) electrically connected to the input side wiring and transmitting a high-speed driving signal to the data driver; and a metal tape overlapping the input side wiring in a plan view and attached on the first flexible printed circuit board, where the metal tape includes a heat discharge part overlapping the data driver in the plan view and disposed in an extending direction of the data driver and a wiring overlapping part disposed in a direction perpendicular to the extending direction of the data driver.

The metal tape may include a metal layer and an adhesive layer, and the adhesive layer may be disposed on the entire surface of the metal tape.

The metal tape may further include an adhesion part which helps attachment on the first flexible printed circuit board, and the heat discharge part, the wiring overlapping part and the adhesion part may be separated from each other in the plan view.

A width of the heat discharge part and a width of the adhesion part may be different from each other.

The width of the heat discharge part and the width of the adhesion part may be the same.

The wiring overlapping part may be separated from an input side pad disposed at an end of the input side wiring by a predetermined distance in the plan view.

The wiring overlapping part may be in contact with the input side pad disposed at the end of the input side wiring in the plan view.

The heat discharge part and the wiring overlapping part may be separated with a predetermined interval, and the separated heat discharge part and wiring overlapping part may be connected to each other by an adhesive contained in the metal tape.

The wiring overlapping part may define a plurality of openings and may have a linear structure disposed along an outer periphery of the wiring overlapping part.

The display device may further include a timing controller which processes an image signal applied from the outside and transmits the processed image signal to the data driver; a second printed circuit board (PCB) in which the timing controller is disposed; and a second flexible printed circuit board connecting the second printed circuit board (PCB) and the first printed circuit board (PCB).

The first printed circuit board (PCB) may be provided in plural, and the first printed circuit boards (PCB) may include a first printed circuit board (PCB) connected to the second flexible printed circuit board and a first printed circuit board (PCB) which is not connected to the second flexible printed circuit board, and the display device may further include a third flexible printed circuit board which connects the first printed circuit board (PCB) which is not connected to the second flexible printed circuit board and the first printed circuit board (PCB) connected to the second flexible printed circuit board.

According to exemplary embodiments, the impedance of the signal has a reduced difference or is set less than a predetermined range by the tape covering the wiring input to the driving chip and including the metal such that transmission performance of the signal to the driving chip is improved.

DETAILED DESCRIPTION

Figure 1:
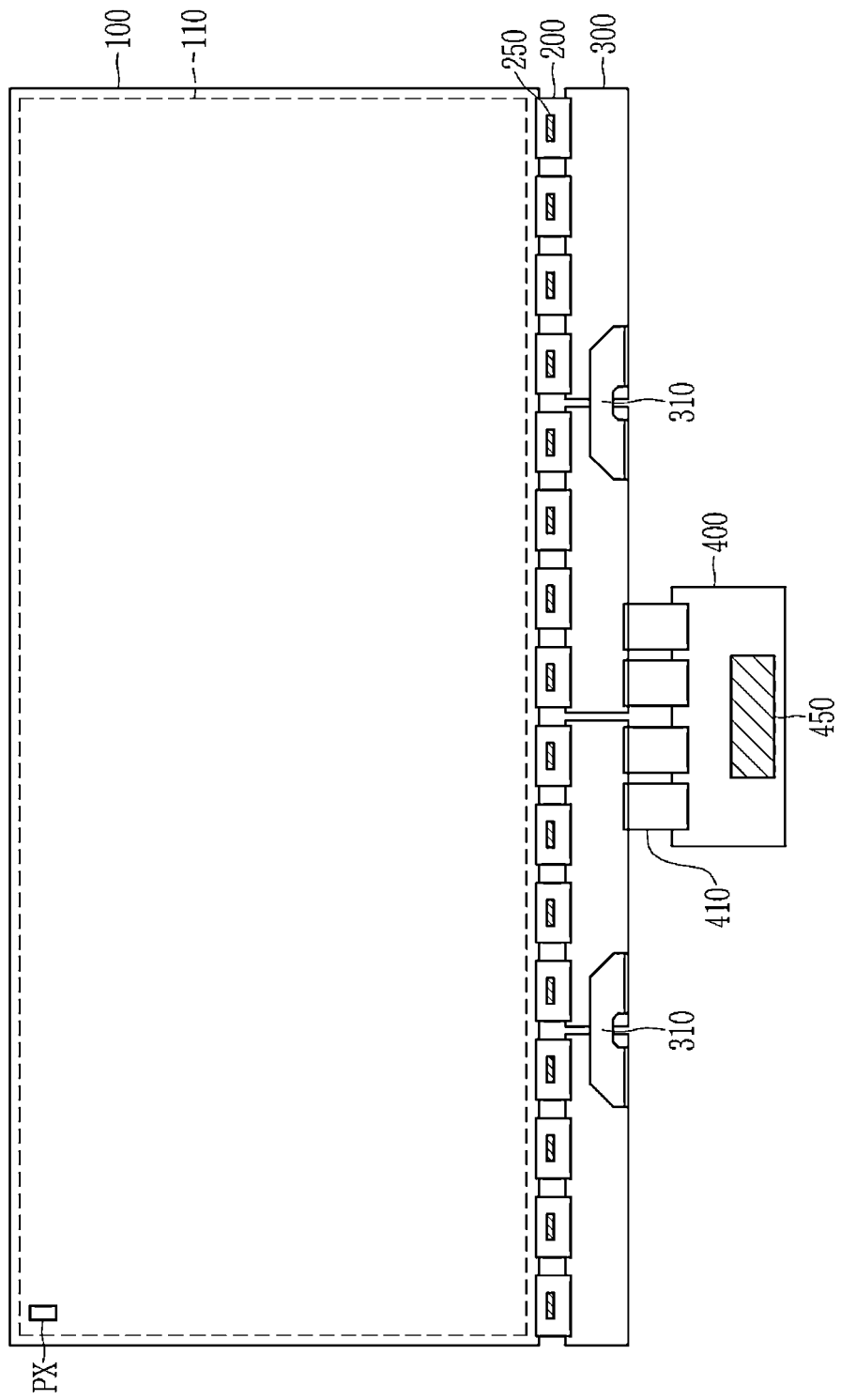
FIG. 1 is a schematic diagram of a display device according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive, and like reference numerals designate like elements throughout the specification.

Further, in the drawings, a size and thickness of each element are arbitrarily represented for better understanding and ease of description, and the present invention is not limited thereto. In the drawings, the thicknesses of layers, films, panels, regions, etc., are exaggerated for clarity. In the drawings, for understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Further, throughout the specification, the word "on a plane" means viewing a target portion from the top, and the word "on a cross-section" means viewing a cross-section formed by vertically cutting a target portion from the side.

Hereinafter, a display device is entirely described with reference to FIG. 1.

FIG. 1 is a schematic diagram of a display device according to an exemplary embodiment.

A display device according to an exemplary embodiment may include a display panel 100, flexible printed circuit boards 200, 310, and 410, printed circuit boards (PCB) 300 and 400, a data driver 250, and a timing controller 450.

The display pane 100 according to the present exemplary embodiment includes a display area 110 in which a plurality of pixels PX are disposed, and a driving unit may be disposed outside the display area 110 by the same process as that of forming the pixels PX. The display panel 100 may be a liquid crystal panel including a liquid crystal, or a light emitting display panel including a light-emitting element. In addition, the display panel 100 of the exemplary embodiment shown in FIG. 1 may be a medium to large display panel.

The plurality of pixels PX included in the display panel 100 may be controlled by various control signals including a scan signal and a data voltage, and may receive a power supply voltage having a constant voltage.

In the liquid crystal panel, the plurality of pixels PX receives the data voltage and the scan signal. The data voltage applied to the pixel PX forms an electric field with a common voltage, and an arrangement direction of liquid crystal molecules is determined depending on the electric field. The liquid crystal panel may further include an additional light unit, and a luminance is expressed while a ratio at which light provided from the light unit is controlled by a polarizer by receiving a phase difference according to the arrangement direction of the liquid crystal molecules.

The light emitting display panel may be an organic light emitting panel including an organic emission layer or an inorganic light emitting display panel including an inorganic emission layer. In the light emitting display panel, the plurality of pixels PX receives the data voltage and at least one scan signal, and may also receive the driving voltage and a low driving voltage as power supply voltages. Also, a light emitting signal may be additionally received. In the organic light emitting panel, an output current of the driving transistor is determined based on the data voltage, and light is emitted while the output current flows to the organic light emitting diode. The luminance of light emitted by the organic light emitting diode is determined according to the magnitude of the current flowing through the organic light emitting diode.

Although not shown in FIG. 1, the display panel 100 includes a scan driver generating the scan signal. The scan driver is disposed outside the display area 110, and may be formed together through the process for forming the plurality of pixels PX.

The light emitting signal used in the organic light emitting device is also provided from a separate driver conforming to the scan driver, and the driver providing the light emitting signal may also be formed together through the process of forming the plurality of pixels PX in some regions outside the display area 110.

In an exemplary embodiment, the data driver 250 (hereinafter referred to as a data driving chip) applying the data voltage is disposed on a first flexible printed circuit board 200 (hereinafter referred to as a flexible printed circuit board for the data driving chip), and the timing controller 450 is disposed on a second printed circuit board (PCB) 400 (hereinafter; referred to as a printed circuit board (PCB) for a timing controller).

The timing controller 450 generates image data and a control signal based on the image signal input from the outside, and the data driver 250 receives the image data from the timing controller 450, changes the image data into the data voltage to be applied to the pixel, and transmits the data voltage to the pixel PX.

The signal outputted from the timing controller 450 is transmitted to the first printed circuit board (PCB) 300 through the second printed circuit board (PCB) 400 and the second flexible printed circuit board 410.

In the exemplary embodiment of FIG. 1, four first printed circuit boards (PCB) 300 are formed and are disposed in pairs of two. The paired two first printed circuit boards (PCB) 300 are electrically connected to each other by a third flexible printed circuit board 310 (also referred to as a flexible printed circuit board for a connection). As a result, if the signal outputted from the timing controller 450 is applied to the first printed circuit board (PCB) 300 through the second printed circuit board (PCB) 400 and the second flexible printed circuit board 410, the signal is transmitted to the second first printed circuit board (PCB) 300 through the third flexible printed circuit board 310. When the first printed circuit boards (PCB) 300 are classified based on the connection relationship, the first printed circuit boards (PCB) 300 are classified based on whether the first printed circuit board (PCB) 300 is directly connected with or not directly connected with the second flexible printed circuit board 410.

The first printed circuit board (PCB) 300 that is directly connected to the second flexible printed circuit board 410 receives the signal outputted from the timing controller 450 through the second printed circuit board (PCB) 400 and the second flexible printed circuit board 410.

The first printed circuit board (PCB) 300 that is not directly connected to the second flexible printed circuit board 410 is connected to the first printed circuit board (PCB) 300 that is directly connected to the second flexible printed circuit board 410 through the third flexible printed circuit board 310. As a result, the first printed circuit board (PCB) 300 that is not directly connected to the second flexible printed circuit board 410 receives the signal outputted from the timing controller 450 through the third flexible printed circuit board 310. Here, the third flexible printed circuit board 310 receives the signal outputted from the timing controller 450 through the second printed circuit board (PCB) 400, the second flexible printed circuit board 410, and the adjacent first printed circuit board (PCB) 300.

The signal transmitted to the first flexible printed circuit board 200 through the first printed circuit board (PCB) 300 may be processed in the data driver 250 and transmitted to the display panel 100. However, some of the signals transmitted to the first flexible printed circuit board 200 may be transmitted to the display panel 100 without passing through the data driver 250.

The control signal (i.e., a data control signal) for the data driver 250 and an image signal among the control signals outputted from the timing controller 450 are transmitted to the data driver 250 disposed in the first flexible printed circuit board 200 and converted into the data voltage, and then the data voltage is transmitted to the display panel 100.

The scan driver control signal (i.e., a scan control signal) among the control signals outputted from the timing controller 450 is transmitted to the scan driver in the display pane 100 through the second printed circuit board (PCB) 400, the second flexible printed circuit board 410, the first printed circuit board (PCB) 300, and the first flexible printed circuit board 200 without passing through the data driver 250.

In the exemplary embodiment of FIG. 1, a total of sixteen first flexible printed circuit boards 200 are included, and a total of sixteen data drivers 250 are included. The data driver 250 may be attached on the first printed circuit board (PCB) 300 in a form of an IC chip.

Also, the timing controller 450 may be attached on the second printed circuit board (PCB) 400 in the form of an IC chip. The second printed circuit board (PCB) 400 may further include a power supply voltage generator for generating a power supply voltage.

The display panel 100, the flexible printed circuit boards 200, 310, and 410, and the printed circuit boards (PCB) 300 and 400 are attached by an anisotropic conductive film ("ACF") and electrically connected to each other.

In an exemplary embodiment, the display device may include only one flexible printed circuit board and one printed circuit board (PCB). In this case, the timing controller 450 may be disposed on the printed circuit board (PCB), and the data driver 250 may be disposed on the flexible printed circuit board, or may be attached and formed on one side region of the display panel 100. Also, in another exemplary embodiment, the flexible printed circuit board or the printed circuit board (PCB) may be additionally included while basically including one flexible printed circuit board and one printed circuit board (PCB).

Hereinafter, the first flexible printed circuit board and its surrounding structures are described in detail with reference to FIG. 2 to FIG. 4.

Figure 2:
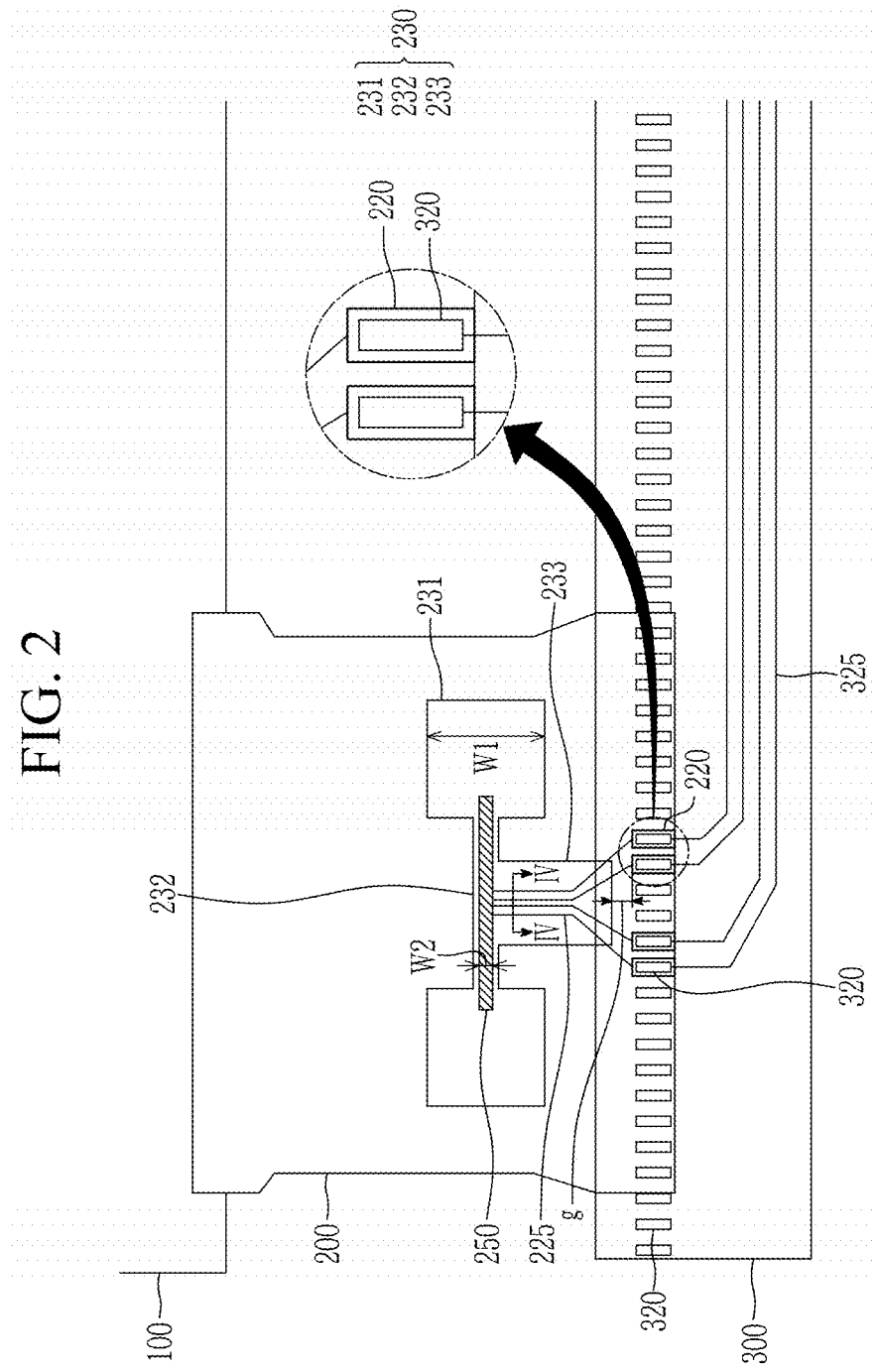
FIG. 2 is a top plan view showing a first flexible printed circuit board and surroundings thereof according to an exemplary embodiment.
Figure 3:
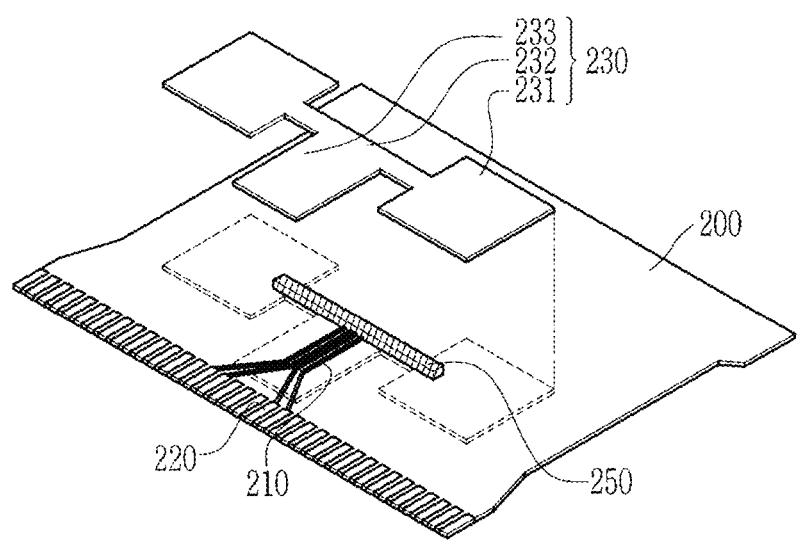
FIG. 3 is an exploded perspective view showing a first flexible printed circuit board and surroundings thereof according to an exemplary embodiment.
Figure 4:
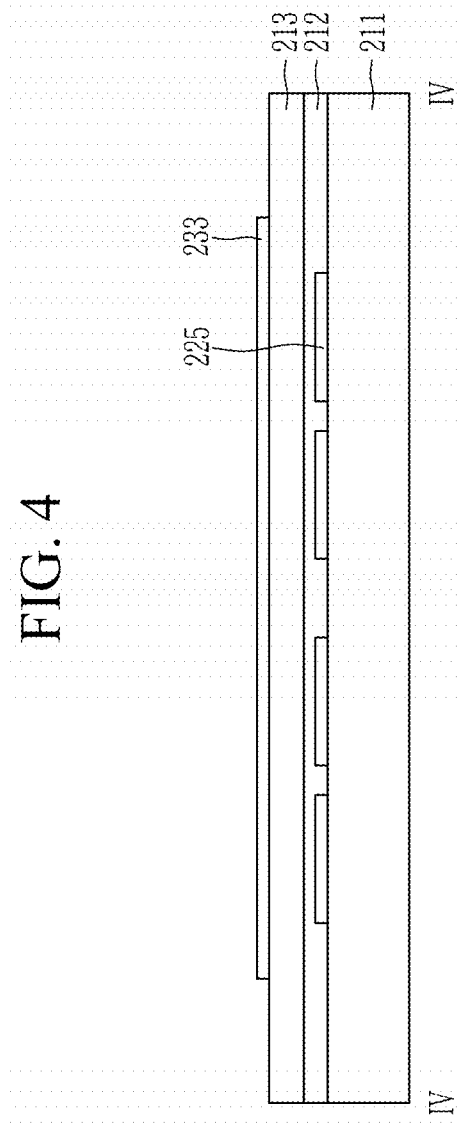
FIG. 4 is a cross-sectional view taken along line IV-IV of FIG. 2.

FIG. 2 is a top plan view showing a first flexible printed circuit board 200 and surroundings thereof according to an exemplary embodiment, FIG. 3 is an exploded perspective view showing a first flexible printed circuit board and surroundings thereof according to an exemplary embodiment, and FIG. 4 is a cross-sectional view taken along line IV-IV of FIG. 2.

First, FIG. 2 and FIG. 3 are described.

FIG. 2 shows the part of the display panel 100 and the part of the first printed circuit board (PCB) 300 with the first flexible printed circuit board 200 as a main portion, and FIG. 3 illustrates the structure of the first flexible printed circuit board 200 in a disassembled state.

Input side wiring 225 connected to the data driver 250 is disposed on the first flexible printed circuit board 200. The part among the wiring input to the data driver 250 is omitted, and wiring (output side wiring) outputted from the data driver 250 to the display panel 100 is also omitted in FIGS. 2 and 3.

An extended input side pad 220 is disposed at the end of the input side wiring 225 connected to the data driver 250. The input side pad 220 is electrically connected to a pad 320 disposed at the end of high-speed driving wiring 325 disposed on the first printed circuit board (PCB) 300. As a result, the input side wiring 225 connected to the data driver 250 is electrically connected to the high-speed driving wiring 325 disposed on the first printed circuit board (PCB) 300, and may have a differential pair transmitting the signal through a pair of wirings like the high-speed driving wiring 325. The input side pad 220 and the pad 320 of the first printed circuit board (PCB) 300 are electrically connected by the anisotropic conductive material (ACF).

The first flexible printed circuit board 200 further includes a metal tape 230 covering the data driver 250 attached in the form of the chip.

The metal tape 230 includes an adhesion part 231, a heat discharge part 232 overlapping the data driver 250, and a wiring overlapping part 233 overlapping the input side wiring 225.

The heat discharge part 232 of the metal tape 230 according to an exemplary embodiment of FIG. 2 absorbs the heat of the data driver 250 to discharge the heat generated while the data driver 250 is operated, transmits the absorbed heat to the adhesion part 231 and/or the wiring overlapping part 233, and resultantly the heat of the data driver 250 is transferred to the first flexible printed circuit board 200 such that the heat is reduced. The heat discharge part 232 according to an exemplary embodiment of FIG. 2 has a structure of which the width W2 is narrower compared with the width W1 of the adhesion part 231.

The adhesion part 231 may be disposed at the right/left ends of the heat discharge part 232 and partially overlap the data driver 250. However, it entirely overlaps the first flexible printed circuit board 200 such that the entire metal tape 230 is attached to the first flexible printed circuit board 200. The width of the adhesion part 231 is wide enough such that the metal tape 230 does not fall, and the heat is well discharged to the first flexible printed circuit board 200. The exemplary embodiment of FIG. 2 has a structure in which the width of the adhesion part 231 is larger than the width of the heat discharge part 232.

The wiring overlapping part 233 is disposed extending from the heat discharge part 232 toward the upper part of the input side wiring 225, and has an overlapped structure in a plan view such that the input side wiring 225 to which the high-speed signal is applied is disposed inside. The wiring overlapping part 233 may eliminate or reduce impedance difference occurring on the high-speed signal transmitting through the input side wiring 225. According to an exemplary embodiment, the size of the wiring overlapping part 233 may be set so as to match the impedance. however, the impedance does not necessarily match, and the difference in impedance may be reduced to reduce the loss in the signal transmission performance. As a result, the capacitance is formed between the metal layer of the input overlap wiring part 233 and the input side wiring 225, thereby reducing a loss due to an impedance difference that may occur when the high-speed signal is transmitted and reducing the impedance difference with a level equivalent to impedance matching.

The wiring overlapping part 233 extends from the heat discharge part 232 and may be extended to a position close to the input side pad 220. In the exemplary embodiment of FIG. 2, a distance between the input side pad 220 and the wiring overlapping part 233 in a plan view is indicated by g, and the g is in a range including 0. As the value of g increases, the capacitance between the metal layer of the wiring overlapping part 233 and the input side wiring 225 decreases. According to the change of the capacitance, the value g may be set for the smallest loss of the capacitance. In another exemplary embodiment, the value of g may have a negative value, such that the wiring overlapping part 233 may be disposed to overlap with the input side pad 220 in a plan view, In still another exemplary embodiment, the wiring overlapping part 233 may pass through the input side pad 220 and extend to the outside of the first flexible printed circuit board 200. The wiring overlapping part 233 has its maximum length in a case of passing through the input side pad 220 and extending to the outside of the first flexible printed circuit board 200, and the wiring overlapping part 233 may have a shorter length than this in general. The wiring overlapping part 233 may be disposed to have an appropriate length by considering a parasitic capacitance with other overlapped wiring and the impedance characteristic. In addition, when the wiring overlapping part 233 overlaps the input side pad 220, the input side pad 220 may be disposed such that there is no problem in being electrically connected to the pad 320 disposed on the first printed circuit board (PCB) 300.

That is, the wiring overlapping part 233 may have various sizes and shapes according to an exemplary embodiment. The minimum width of the wiring overlapping part 233 is a case that the wiring overlapping part 233 has the same width as the width of the input side wiring 225 to which the high-speed signal is applied, and in this case, an opening is defined at the part between two pairs of input side wirings 225 such that the wiring overlapping part 233 is not disposed on the part between two pairs of input side wirings 225. The wiring overlapping part 233 may be wider than the minimum width in general, and may be disposed to have an appropriate width by considering the parasitic capacitance and the impedance characteristics with other overlapped wiring.

According to an exemplary embodiment, the wiring overlapping part 233 may define the opening of various structures, and some exemplary embodiments are shown in FIG. 14, FIG. 18, FIG. 21, and FIG. 24.

Also, the wiring overlapping part 233 does not overlap the output side wiring from the data driver 250 to the display panel 100 such that the signal delay is not generated by the parasitic capacitance in the wiring transmitting the signal to the display panel 100. In addition, the heat discharge part 232 also does not have the part overlapping the output side wiring except for the part required during the heat discharge to minimize the overlapping area with the output side wiring, thereby having the structure reducing the problem due to the parasitic capacitance.

FIG. 4 shows the cross-sectional view taken along line IV-IV of FIG. 2, and the cross-sectional structure of the first flexible printed circuit board 200 is shown.

In the first flexible printed circuit board 200, in a cross-sectional view, a film layer 211, input side wiring 225, an insulating layer 212, an adhesive layer 213, and a wiring overlapping part 233 of the metal tape 230 are sequentially disposed from a bottom. In FIG. 4, at a position of the cross-section, the wiring overlapping part 233 is only shown among the metal tape 230, and the input side wiring 225 is only shown among the various wirings, the part of the other metal tape 230 is disposed in the same position as the wiring overlapping part 233, and the various other wirings are disposed in the same position as the input side wiring 225.

The film layer 211 is formed of or includes a material having a flexible characteristic such as a polyimide, and various wirings including the input side wiring 225 made of or including a metal are formed thereon. An insulating layer 212 is disposed on the various wirings including the input side wiring 225, and an adhesive layer 213 is disposed thereon such that the wiring overlapping part 233 of the metal tape 230 is attached thereon.

In the present exemplary embodiment, the adhesive layer 213 is attached to the first flexible printed circuit board 200, the wiring overlapping part 233 of the metal tape 230 is attached to the adhesive layer 213, and the width of the adhesive layer 213 is larger than the width of the wiring overlapping part 233 of the metal tape 230. However, in an exemplary embodiment, the adhesive layer 213 may be disposed at the entire bottom surface of the metal tape 230 to have the same width as the cross-section of the wiring overlapping part 233 of the metal tape 230. (Referring to FIG. 16)

As shown in FIG. 4, the wiring overlapping part 233 overlaps the input side wiring 225 in the vertical direction, thereby configuring the parasitic capacitor along with the adhesive layer 213 and the insulating layer 212 disposed therebetween. The impedance difference on the transmission path is reduced by the capacitance of the parasitic capacitor such that the signal transmission performance may be prevented from being deteriorated due to the impedance difference.

In addition, in FIG. 4, the parasitic capacitance between the wiring overlapping part 233 and the input side wiring 225 is also affected by the distance between them. As a result, it is also possible to modify the thickness of the adhesive layer 213 and/or the insulating layer 212 disposed therebetween to reduce the difference in the impedance on the transmission line.

Figure 5:
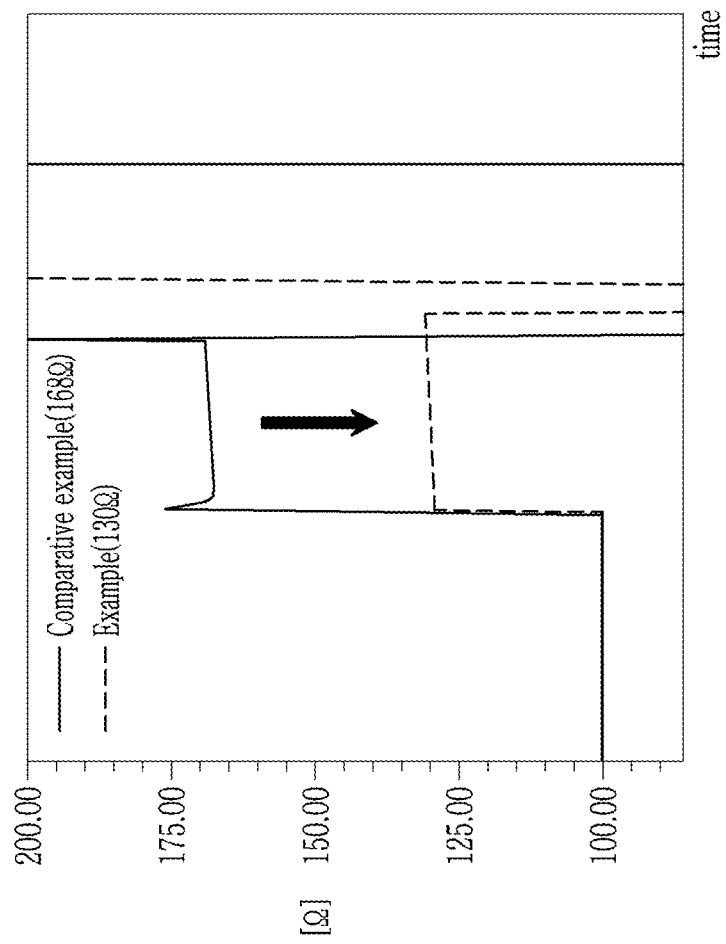
FIG. 5 is a graph showing an impedance characteristic of a signal transmitted to a driving chip in a display device according to an exemplary embodiment.

The effect of reducing the impedance difference may be shown through a graph of FIG. 5.

FIG. 5 is a graph showing an impedance characteristic of a signal transmitted to a driving chip in a display device according to an exemplary embodiment.

FIG. 5 shows a change of an impedance (ohm: Ω) value (y axis) depending on time (x axis), where a comparative example is a structure which does not include the wiring overlapping part 233, and an exemplary embodiment means a case having the structure of FIG. 2 to FIG. 4.

As shown in FIG. 5, in the comparative example, while the signal is transmitted from the first printed circuit board (PCB) 300 to the first flexible printed circuit board 200, the impedance value is changed from 100Ω to 168Ω such that the difference of the impedance value of 68Ω is generated. However, in the exemplary embodiment of FIG. 2 to FIG. 4, the impedance value is reduced to 130Ω by the parasitic capacitance due to the wiring overlapping part 233 such that the difference of the impedance value (i.e., changed value) is reduced to 30Ω.

As a result, the exemplary embodiment of FIG. 2 to FIG. 4 does not reach the impedance matching in which the impedance difference does not exist. However, the difference of the impedance value is reduced by half or more compared with the comparative example such that the loss generated during the signal transmission due to the impedance difference is reduced. As a result, a merit that the signal transmission performance is improved may be obtained.

The change in the value of the impedance may be varied depending on the width, length (the value g), and structure of the wiring overlapping part 233.

Figure 6A:
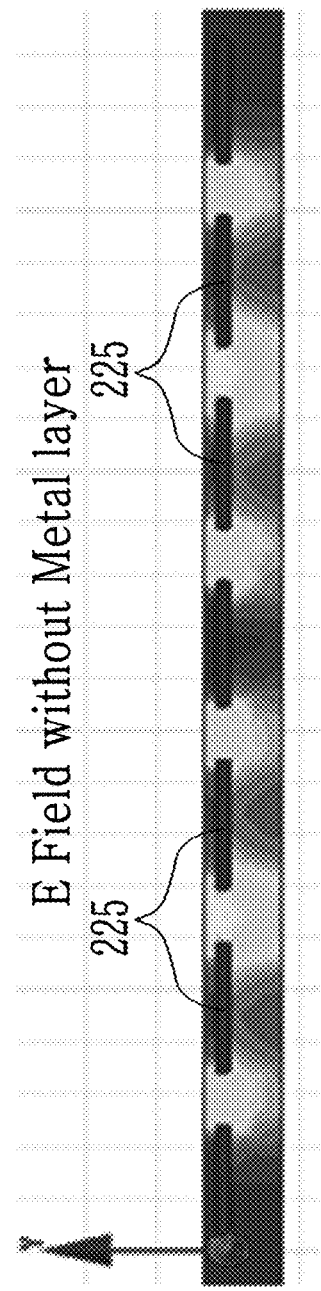
FIGS. 6A and 6B are views showing an electric field characteristic on a cross-section of a first flexible printed circuit board according to a comparative example and an exemplary embodiment.
Figure 6B:
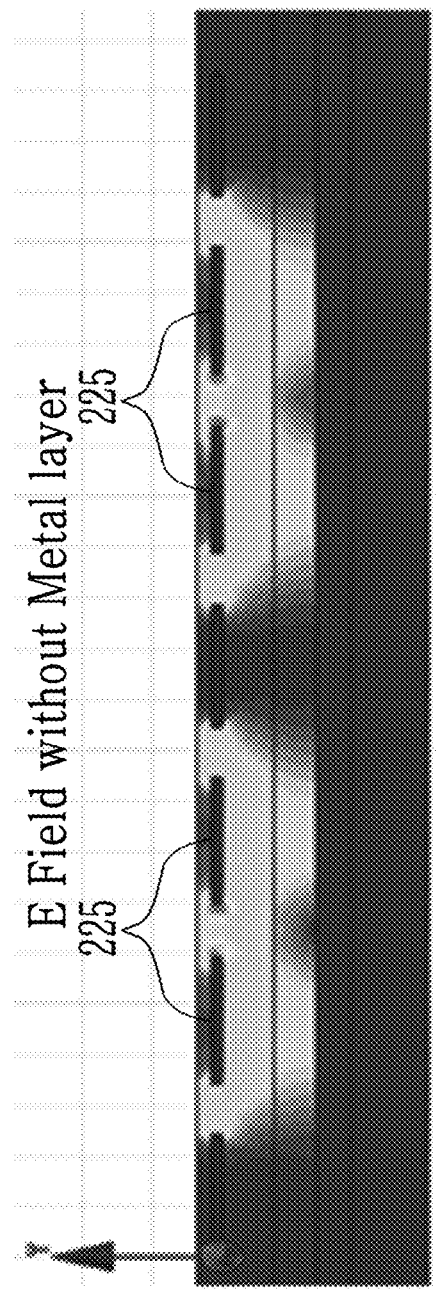

Next, an electric field characteristic on a cross-sectional view is compared through FIGS. 6A and 6B.

FIGS. 6A and 6B are views showing an electric field characteristic on a cross-section of a first flexible printed circuit board according to a comparative example and an exemplary embodiment.

FIG. 6A shows the electric field characteristic on the cross-section in the comparative example without the wiring overlapping part 233 (i.e., metal layer), and FIG. 6B shows the electric field characteristic on the cross-section in the exemplary embodiment including the wiring overlapping part 233 (i.e., metal layer).

Comparing FIG. 6A and FIG. 6B, it may be clearly confirmed that there is a difference in the electric field around the input side wiring 225, and it may be confirmed that the electric field between a pair of input side wirings 225 is improved in FIG. 6B compared to FIG. 6A, such that the crosstalk caused by the electric field with other wiring is reduced.

Hereinafter, a route through which the signal is applied from the display device to the data driver 250 is expressed as transmission lines in FIG. 7, and a comparative example and an exemplary embodiment are compared and described through an eye diagram in the input side of the data driver 250 in FIGS. 8 and 9.

Figure 7:
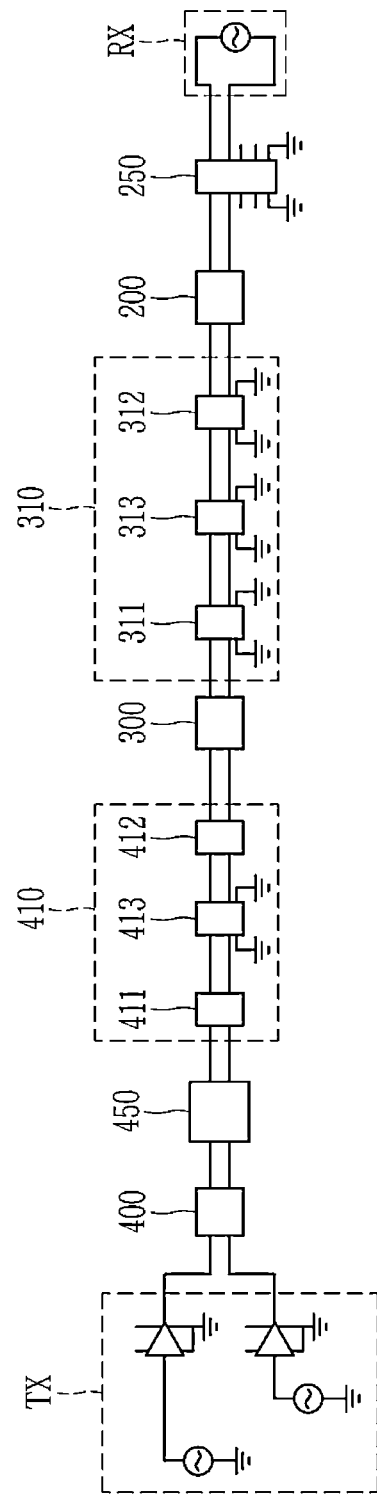
FIG. 7 is an equivalent circuit diagram for a transmission path of a display device according to an exemplary embodiment of FIG. 1.
Figure 8:
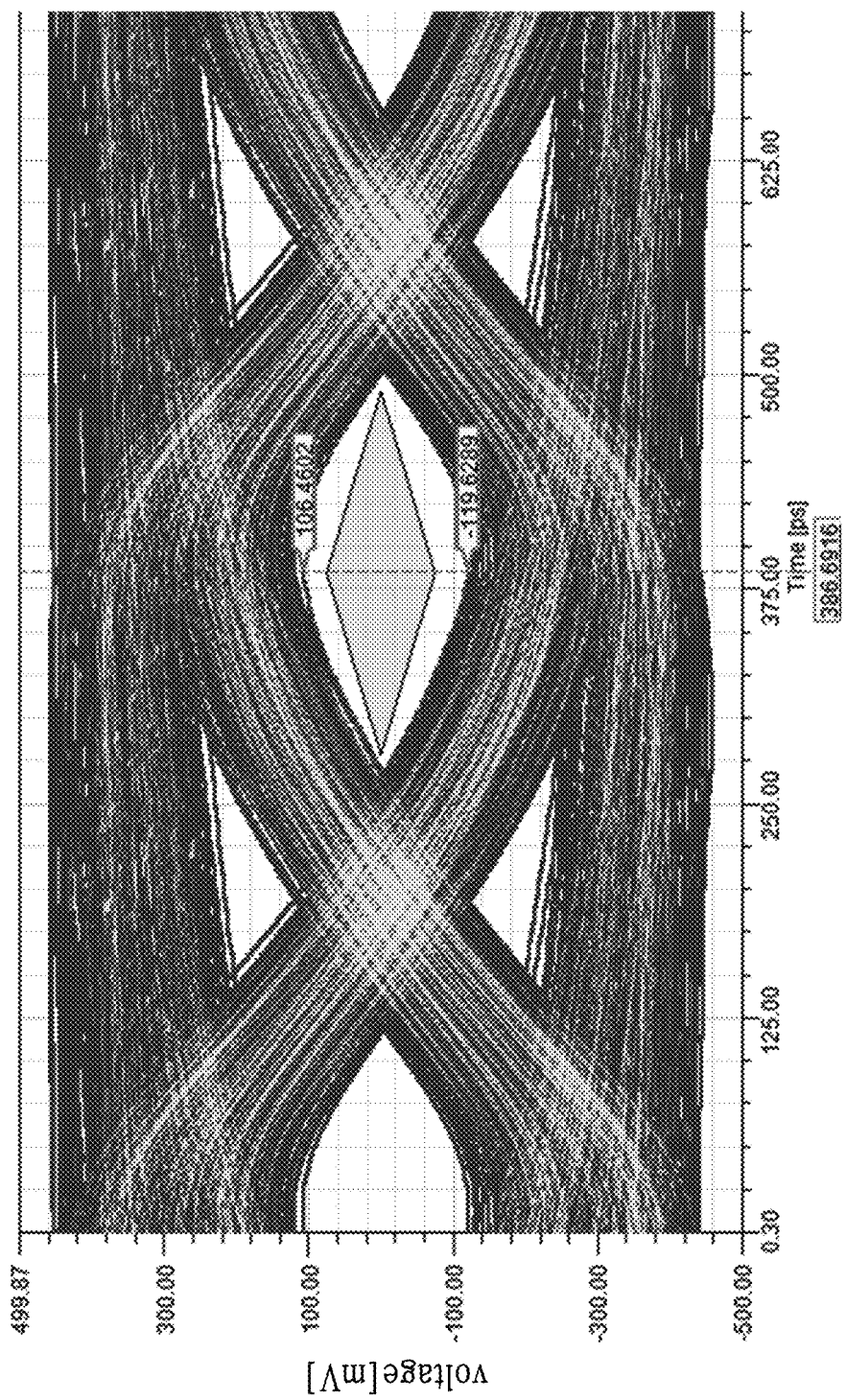
FIG. 8 is an eye diagram in an input side of a data driver according to an exemplary embodiment.
Figure 9:
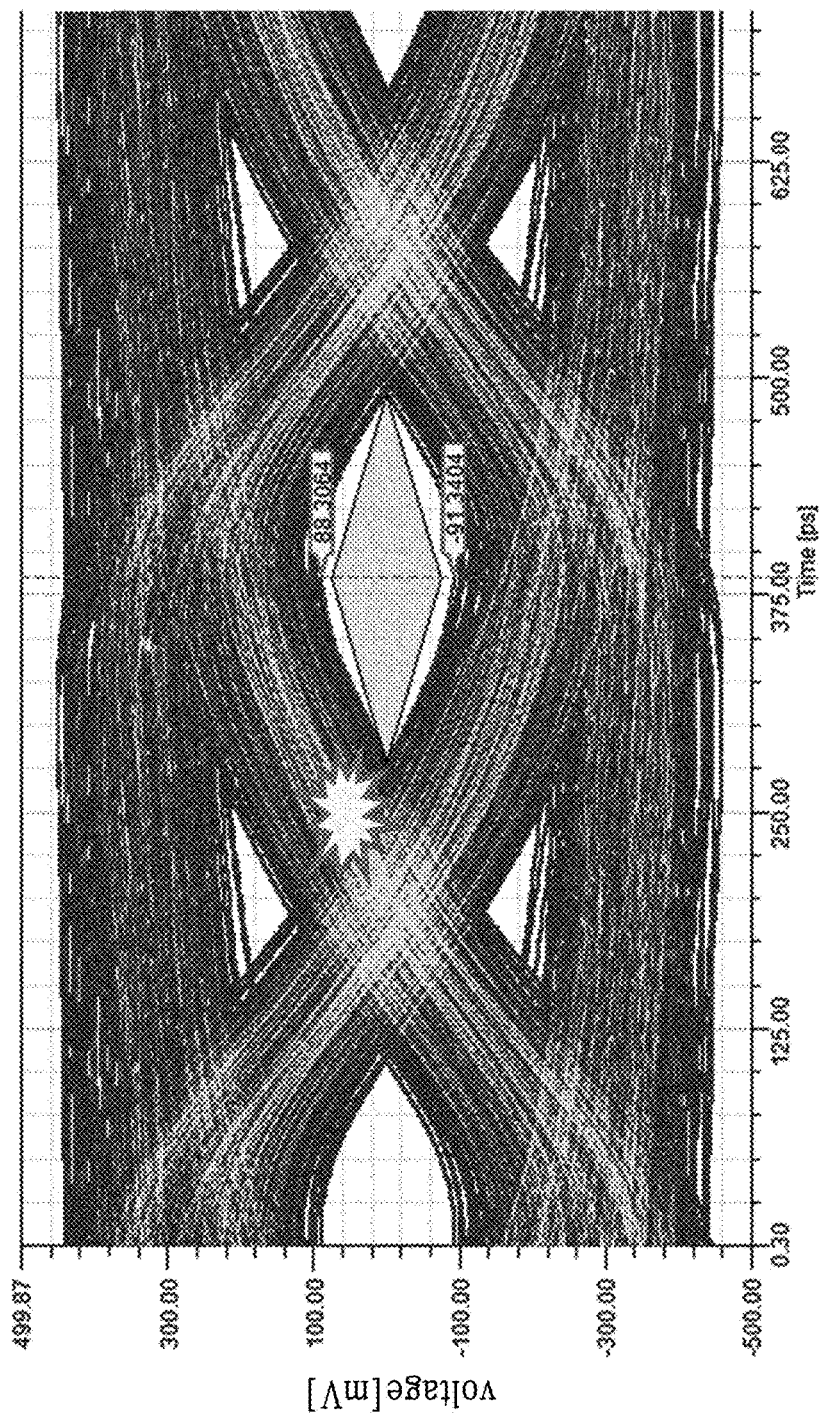
FIG. 9 is an eye diagram in an input side of a data driver according to a comparative example.

FIG. 7 is an equivalent circuit diagram for a transmission path of a display device according to an exemplary embodiment of FIG. 1, FIG. 8 is an eye diagram in an input side of a data driver according to an exemplary embodiment, and FIG. 9 is an eye diagram in an input side of a data driver according to a comparative example.

First, FIG. 7 is compared with the structure of FIG. 1 and described as follows.

In FIG. 1, the first printed circuit board (PCB) 300 that is not directly connected to the second flexible printed circuit board 410 receives the signal outputted from the timing controller 450 through the third flexible printed circuit board 310 which receives the signal via the second printed circuit board (PCB) 400, the second flexible printed circuit board 410, and the adjacent first printed circuit board (PCB) 300. Here, a terminal TX connected from the outside to the timing controller 450 and a terminal RX outputting the signal from the data driver 250 to the display panel 100 are additionally disposed to configure an equivalent circuit diagram for the transmission line as shown in FIG. 7.

Referring to FIG. 7, the terminal TX connected from the outside to the timing controller 450 is formed of or includes a pair of wirings to transmit and output the signal, thereby this is shown as a diode amplifier structure. This is not an illustration of the configuration of an actual terminal TX, but is simply illustrated as an equivalent circuit. The terminal TX connected from the outside to the timing controller 450 may be disposed on the second printed circuit board (PCB) 400.

Next to the terminal TX for input from the outside to the timing controller 450, the second printed circuit board (PCB) 400 and the timing controller 450 are disposed. Here, the characteristics illustrated as the second printed circuit board (PCB) 400 is the sum of both the part that the signal is input to the timing controller 450 and the part that the signal is output to the timing controller 450.

The second flexible printed circuit board 410 is disposed next to the timing controller 450. The second flexible printed circuit board 410 is shown by dividing an input terminal 411, an output terminal 412, and a wiring part 413 therebetween.

In the subsequent location of the second flexible printed circuit board 410, the first printed circuit board (PCB) 300 is disposed, and is simply illustrated. The characteristic of the part to which the second flexible printed circuit board 410 and the first printed circuit board (PCB) 300 are electrically connected is illustrated as the output terminal 412 of the second flexible printed circuit board 410.

In the subsequent location of the first printed circuit board (PCB) 300, a third flexible printed circuit board 310 is disposed and is illustrated as including an input terminal 311, an output terminal 312, and a wiring part 313 therebetween. The characteristic of the part to which the first printed circuit board (PCB) 300 and the third flexible printed circuit board 310 are electrically connected is illustrated as the input terminal 311 of the third flexible printed circuit board 310.

In the subsequent location of the third flexible printed circuit board 310, the first printed circuit board (PCB) 300 is disposed, and this is the first printed circuit board (PCB) 300 that is not directly connected to the second flexible printed circuit board 410.

In the subsequent location of the first printed circuit board (PCB) 300, the data driver 250 is disposed, and the terminal RX outputting the signal to the display panel 100 from the data driver 250 is disposed in the subsequent location of the data driver 250.

The signal characteristic at the input side of the data driver 250 among these transmission lines is described as shown in FIG. 8, and for comparison, a case of a comparative example is shown in FIG. 9.

FIG. 8 and FIG. 9 simulate the high-speed driving signal of 3.4 gigabits (Gbps) in the input terminal of the data driver 250.

FIG. 8 and FIG. 9 show the change of the voltage (millivolts: mV in y axis) depending on time (picoseconds: ps in x axis), and the values that are changed while the high-speed driving signal is applied are accumulated and shown. The rhombus positioned at the center of FIG. 8 and FIG. 9 has an eye shape and is called an eye diagram. If there is no part where the shape of the eye overlaps with the surrounding signal waveform, it indicates that the display device matches a signal specification, while if a part among the shape of the eye overlaps the surrounding signal waveform, the signal specification is not satisfied, and it indicates that an error is generated during the signal transmission.

FIG. 8 is a simulation diagram for the exemplary embodiment of FIG. 2 to FIG. 4, and a space is formed around the shape of the eye such that it may be confirmed that even if the high-speed driving signal of 3.4 Gbps is applied, there is a margin and there is no problem of erroneous transmission. As a result, it may be predicted that it may be used in high-speed driving of higher than 3.4 Gbps (for example, 4 Gbps, or 6 Gbps). Particularly, if the impedance difference is reduced by adjusting the parasitic capacitance that the wiring overlapping part 233 forms with the input side wiring 225, there is no problem of mistransmission even in the various high-speed driving.

On the other hand, FIG. 9 is a simulation diagram for the structure of the comparative example not including the wiring overlapping part 233, unlike FIG. 2 to FIG. 4, and it may be confirmed that the part of the eye shape is obscured by the waveform when driving at the 3 Gbps high speed and this is illustrated by the spark shape on the waveform of FIG. 9. Therefore, in the comparative example, there is a high possibility of an error transmission problem when being driven at the high speed of 3.4 Gbps, and it may be difficult to be used in the high-speed driving.

Next, numerous variations of exemplary embodiments of the metal tape 230 shown in FIG. 2 to FIG. 4 are described.

Figure 10:
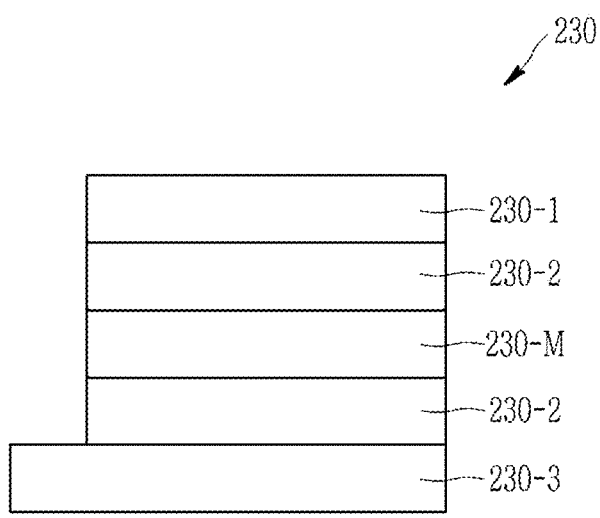
FIG. 10 is an enlarged cross-sectional view of a metal tape according to an exemplary embodiment.

The cross-sectional structure of the metal tape 230 according to an exemplary embodiment is described through FIG. 10.

FIG. 10 is an enlarged cross-sectional view of a metal tape according to an exemplary embodiment.

The metal tape 230 according to an exemplary embodiment of FIG. 10 includes a metal layer 230-M and an adhesive layer 230-2, and a reinforcement layer 230-1 and a release layer 230-3 are disposed on respective sides of the metal layer 230-M as shown in FIG. 10. The reinforcement layer 230-1 serves to protect the metal tape 230, and is attached by using the adhesive layer 230-2 disposed inside the release layer 230-3 after the release layer 230-3 is removed upon attachment.

The metal layer 230-M, the adhesive layer 230-2, and the reinforcement layer 230-1 of FIG. 10 may be disposed on all of the adhesion part 231, the heat discharge part 232, and the wiring overlapping part 233. The metal layer 230-M disposed on the heat discharge part 232 plays a main role in absorbing and transferring the heat emitted from the data driver 250, and the metal layer 203-M disposed on the wiring overlapping part 233 transfers the heat, but plays a major role in reducing the difference in the impedance by generating the parasitic capacitance with the input side wiring 225. The adhesive layer 230-2 disposed on the adhesion part 231 allows the metal tape 230 to be fixed to the first flexible printed circuit board 200, and the metal layer 230-M disposed on the adhesion part 231 plays a major role in the heat transferring and releases the heat to the first flexible printed circuit board 200.

Hereinafter, an integral exemplary embodiment and a separate exemplary embodiment are described through FIG. 11 and FIG. 12.

Figure 11:
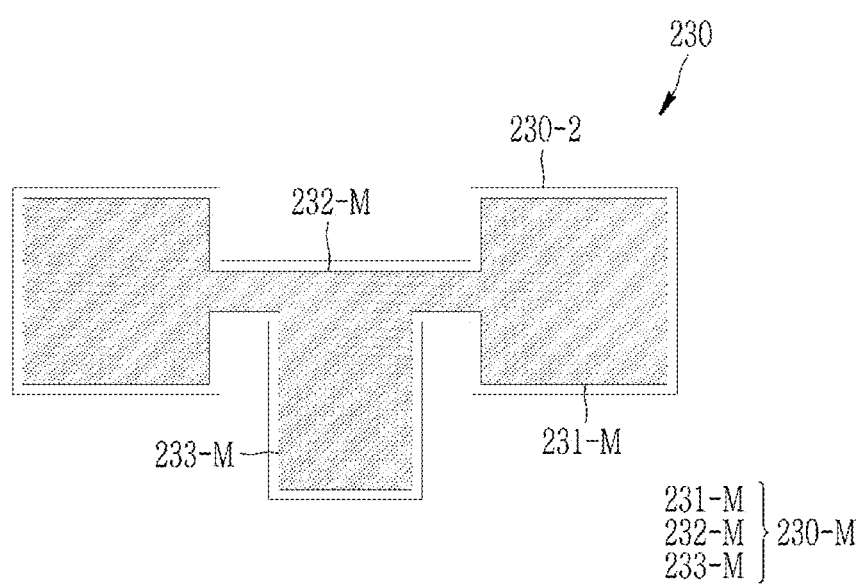
FIG. 11 and FIG. 12 are top plan views of a metal tape according to an exemplary embodiment.
Figure 12:
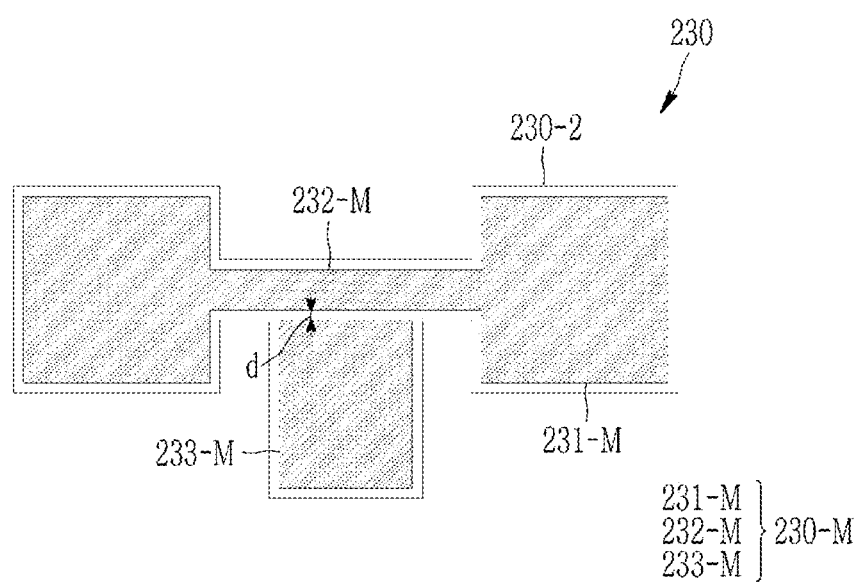

FIG. 11 and FIG. 12 are top plan views of a metal tape according to an exemplary embodiment.

The exemplary embodiment of FIG. 11 shows an integral metal tape 230 of the same shape as shown in FIG. 2 to FIG. 4.

FIG. 11 shows the metal tape 230 of which the adhesive layer 230-2 and the metal layer 230-M are disposed together, unlike FIG. 2 to FIG. 4. FIG. 11 shows that the adhesive layer 230-2 has a wider width than the metal layer 230-M in order to be shown in a plan view, but in an exemplary embodiment, they may have outlines that match each other or the adhesive layer 230-2 may be disposed inside.

The metal layer 230-M includes an adhesion metal layer 231-M corresponding to the adhesion part 231, a heat discharge metal layer 232-M corresponding to the heat discharge part 232, and a wiring overlapping metal layer 233-M corresponding to the wiring overlapping part 233.

On the other hand, in the exemplary embodiment of FIG. 12, unlike the exemplary embodiment of FIG. 11, the wiring overlapping metal layer 233-M among the metal layer 230-M has a structure that is separated from the heat discharge metal layer 232-M.

The wiring overlapping metal layer 233-M and the heat discharge metal layer 232-M are separated, but have a structure in which they are connected by the adhesive layer 230-2. An interval d between the wiring overlapping metal layer 233-M and the heat discharge metal layer 232-M may be various according to an exemplary embodiment, and a degree such that they are capable of maintaining the connection without separation of the two metal layers by the adhesive layer 230-2 may be provided.

In FIG. 11 and FIG. 12, the adhesive layer 230-2 disposed under the metal layer 230-M is included. According to an exemplary embodiment, the parasitic capacitance between the wiring overlapping part 233 and the input side wiring 225 may be changed by changing the thickness of the adhesive layer 230-2. That is, the thickness of the adhesive layer 230-2 may be increased to reduce the parasitic capacitance, or the thickness of the adhesive layer 230-2 may be decreased to increase the parasitic capacitance. The signal transmission ability may be improved by reducing the impedance difference.

Hereinafter, a linear exemplary embodiment is described through FIG. 13 to FIG. 16.

First, the structure of the metal tape of the linear exemplary embodiment is described with reference to FIG. 13.

Figure 13:
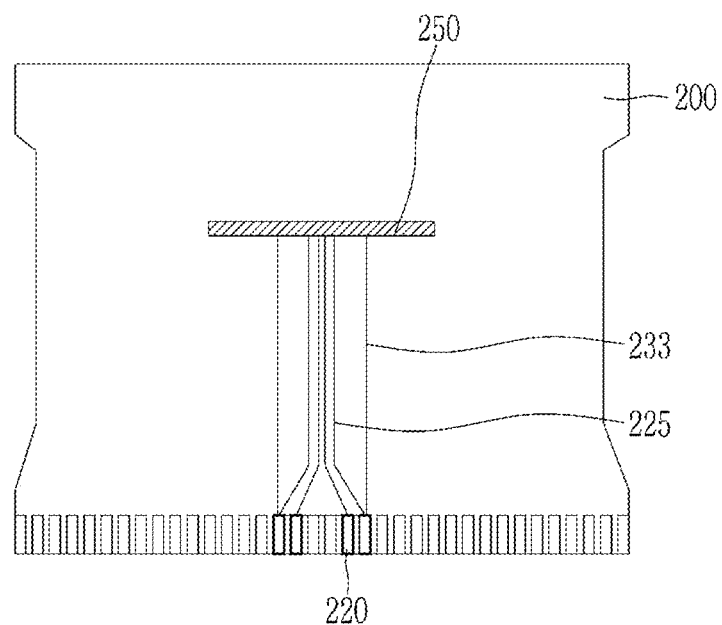
FIG. 13 is a top plan view of a first flexible printed circuit board including a metal tape according to an exemplary embodiment.

FIG. 13 is a top plan view of a first flexible printed circuit board of a metal tape according to an exemplary embodiment.

In FIG. 13, unlike FIG. 2 to FIG. 4, the metal tape has the structure only including the wiring overlapping part 233 without including the adhesion part 231 and the heat discharge part 232.

Also, the exemplary embodiment of FIG. 13 shows the structure in which the end of the wiring overlapping part 233 matches one side of the input side pad 220. However, the end of wiring overlapping part 233, as shown in FIG. 2, may be separated from one side of the input side pad 220 or may overlap the input side pad 220. This is the same in FIG. 14 to FIG. 25. The width of the wiring overlapping part 233 may also have the minimum width overlapping only the input side wiring 225.

The metal tape according to the exemplary embodiment of FIG. 13 can be used in a case when it is not necessary to form the heat discharge part 232 since the heat discharge of the data driver 250 is easy. Also, the exemplary embodiment of FIG. 13 does not have the part overlapping the output side wiring such that there is also a merit that there is no problem of the signal transmitted to the display pane 100 being delayed by parasitic capacitance.

Figure 14:
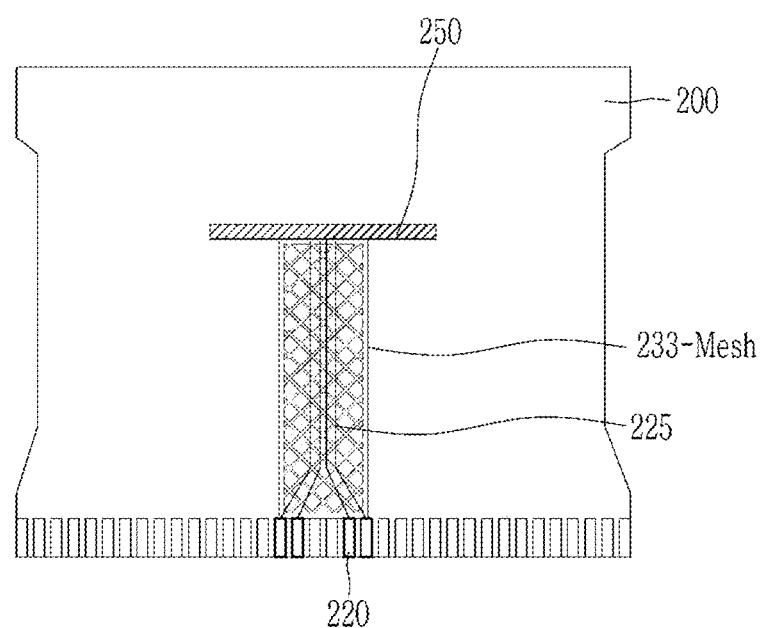
FIG. 14 is a top plan view of a first flexible printed circuit board including a metal tape according to an exemplary embodiment.

The linear exemplary embodiment as shown in FIG. 13 may be additionally modified to have a mesh structure like FIG. 14.

FIG. 14 is a top plan view of a first flexible printed circuit board including a metal tape according to an exemplary embodiment.

In FIG. 14, the wiring overlapping part having the straight shape defines a plurality of openings of a rhombus structure. Hereinafter, this is also referred to as a mesh structure. Also, in the present exemplary embodiment, since the mesh structure includes the linear pattern along the outer periphery of the wiring overlapping part 233-Mesh, the opening does not have the structure connected to the outside. However, according to an exemplary embodiment, the shape of the opening may be various, such as circular, and the size and arrangement of the opening may be irregularly defined or the opening may be connected to the outside. The parasitic capacitance between the wiring overlapping part 233-Mesh and the input side wiring 225 may be adjusted through the area of the opening in the mesh pattern such that the impedance difference may be controlled by controlling the area.

In addition, in the exemplary embodiment of FIG. 14, the structure in which the end of the wiring overlapping part 233-Mesh having the mesh pattern coincides with one side of the input side pad 220 is shown. However, the end of the wiring overlapping part 233-Mesh having the mesh pattern, as shown in FIG. 2, may be separated from one side of the input side pad 220.

Hereinafter, an exemplary embodiment additionally that is modified to include the adhesive layer 230-2 as shown in FIG. 10 and FIG. 11 is described with reference to FIG. 15 and FIG. 16.

Figure 15:
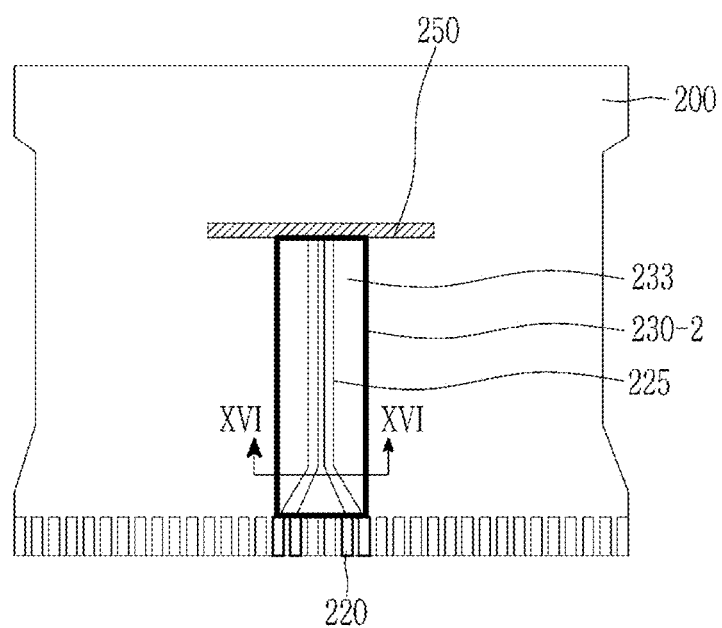
FIG. 15 is a top plan view of a first flexible printed circuit board including a metal tape according to an exemplary embodiment.
Figure 16:
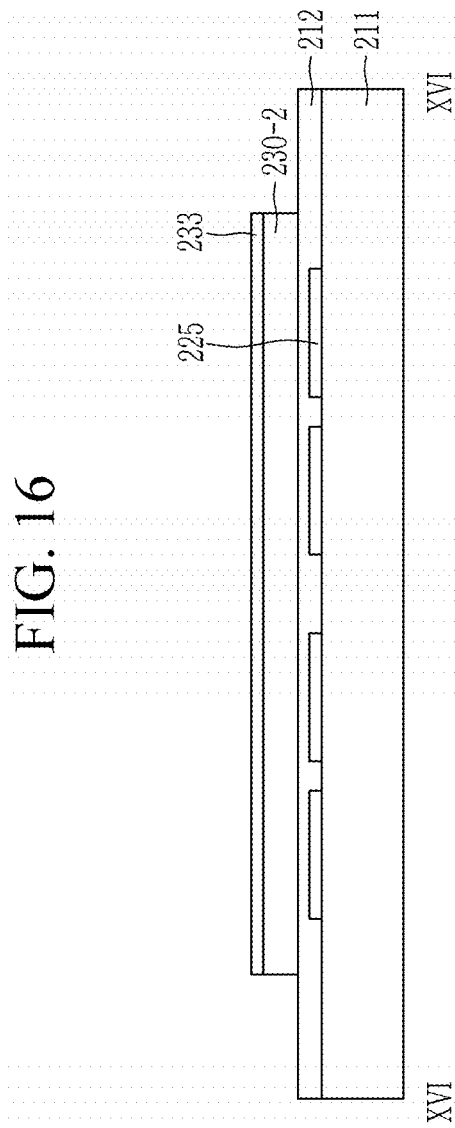
FIG. 16 is a cross-sectional view taken along line XVI-XVI of FIG. 15.

FIG. 15 is a top plan view of a first flexible printed circuit board including a metal tape according to an exemplary embodiment, and FIG. 16 is a cross-sectional view taken along line XVI-XVI of FIG. 15.

The exemplary embodiment of FIG. 15 is an exemplary embodiment in which the adhesive layer 230-2 is further included in the exemplary embodiment of FIG. 13, the wiring overlapping part 233 is indicated by a thicker line to show the adhesive layer 230-2 in a plan view, and the adhesive layer 230-2 is marked on the corresponding thick line.

If this is described as a cross-section, it is the same as that of FIG. 16, and compared to FIG. 4, the adhesive layer 230-2 is disposed to have the same width as the wiring overlapping part 233.

That is, the film layer 211, the input side wiring 225, and the insulating layer 212 configuring the first flexible printed circuit board 200 are sequentially disposed, and the adhesive layer 230-2 and the wiring overlapping part 233 configuring the metal tape are sequentially disposed thereon. Next, in FIG. 19, FIG. 22, and FIG. 25, the cross-sectional structure of the adhesive layer 230-2 and the metal tape shown in FIG. 16 is shown by a thick outer line, as in FIG. 15, in a plan view.

Hereinafter, various exemplary embodiments are illustrated with reference to FIG. 17 to FIG. 25.

FIG. 17 to FIG. 25 top plan views of a first flexible printed circuit board including a metal tape according to an exemplary embodiment.

Figure 17:
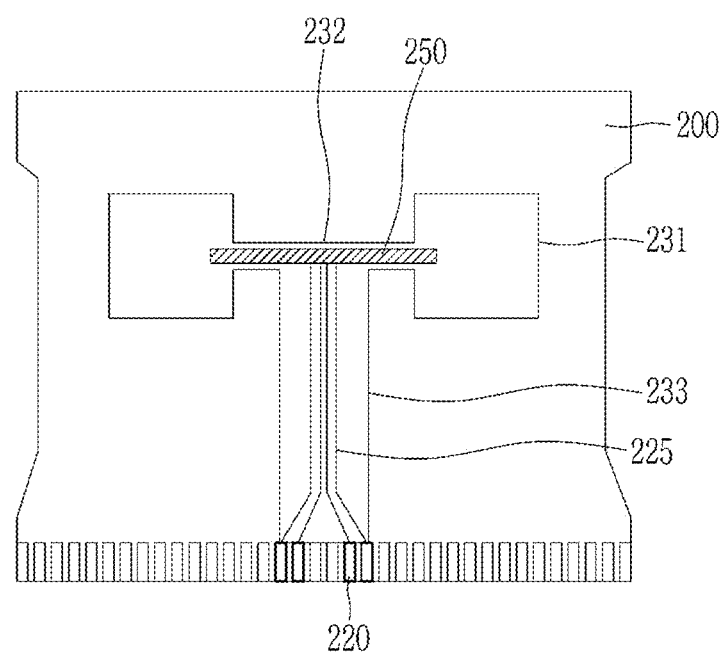
FIG. 17 to FIG. 25 are top plan views of a first flexible printed circuit board including a metal tape according to an exemplary embodiment.
Figure 18:
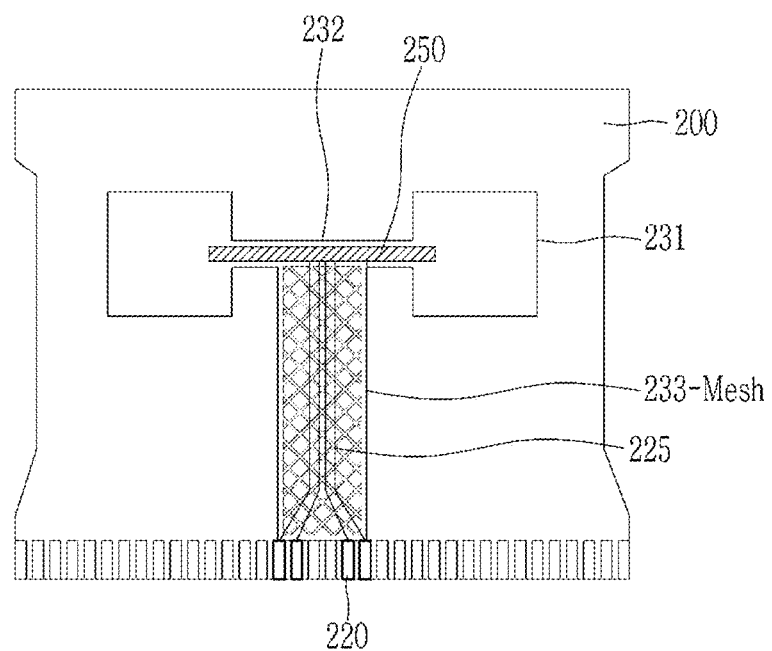
Figure 19:
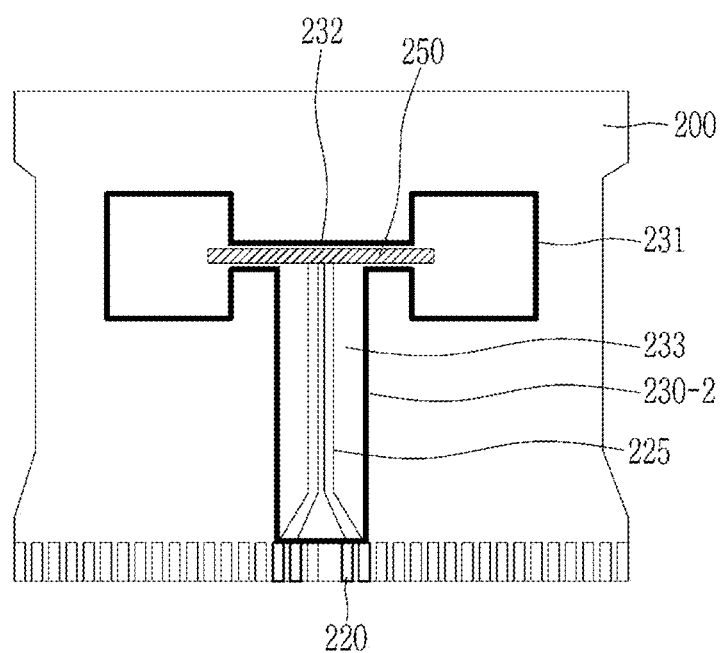
Figure 21:
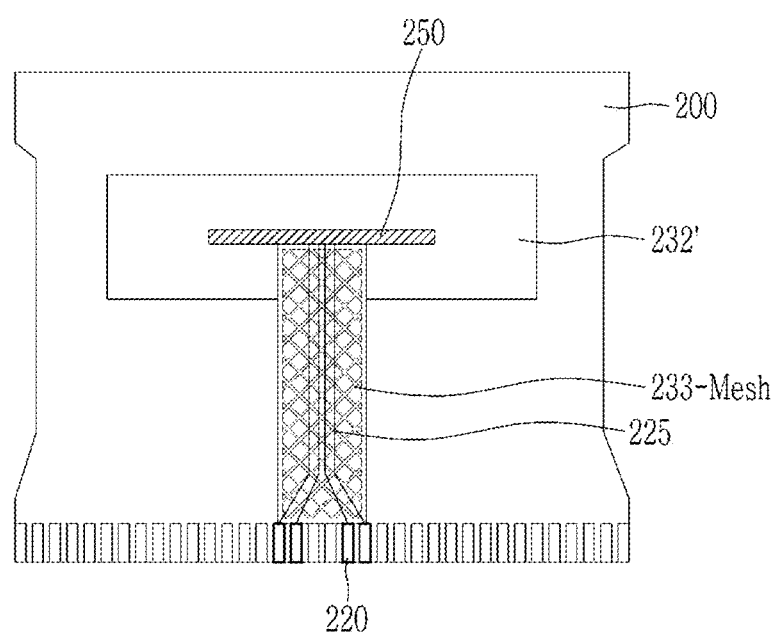
Figure 22:
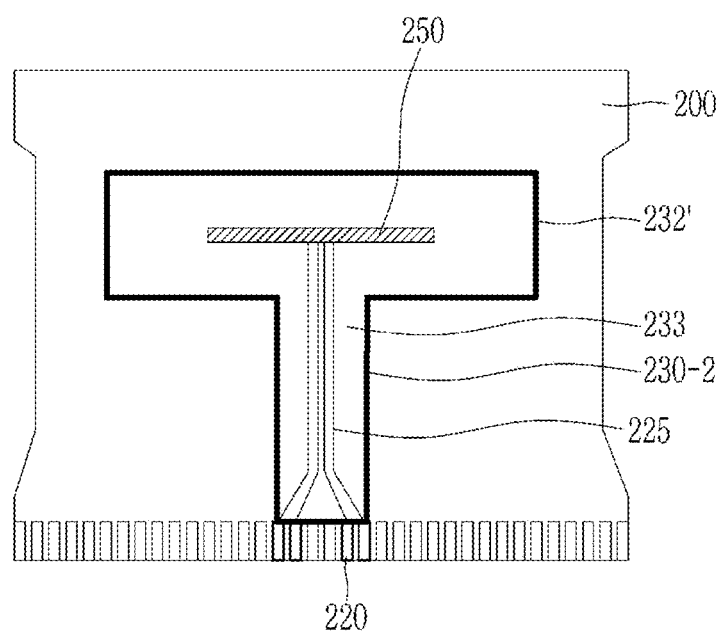
Figure 23:
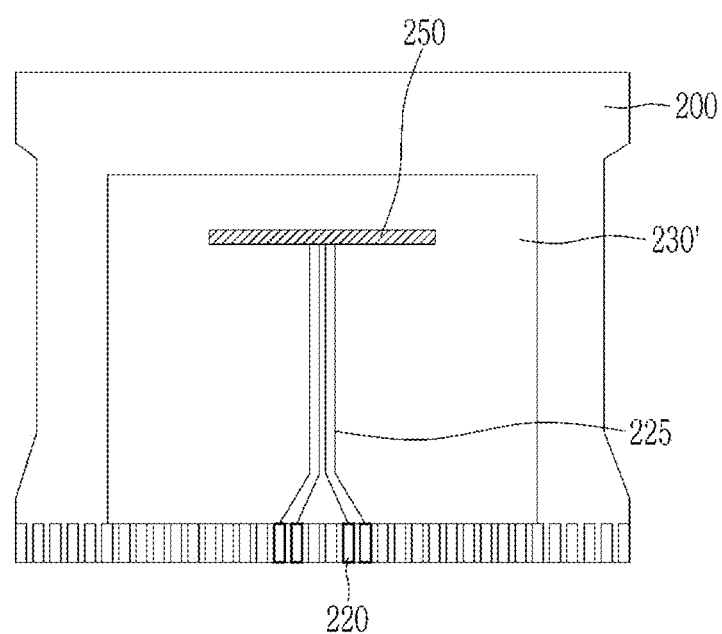
Figure 24:
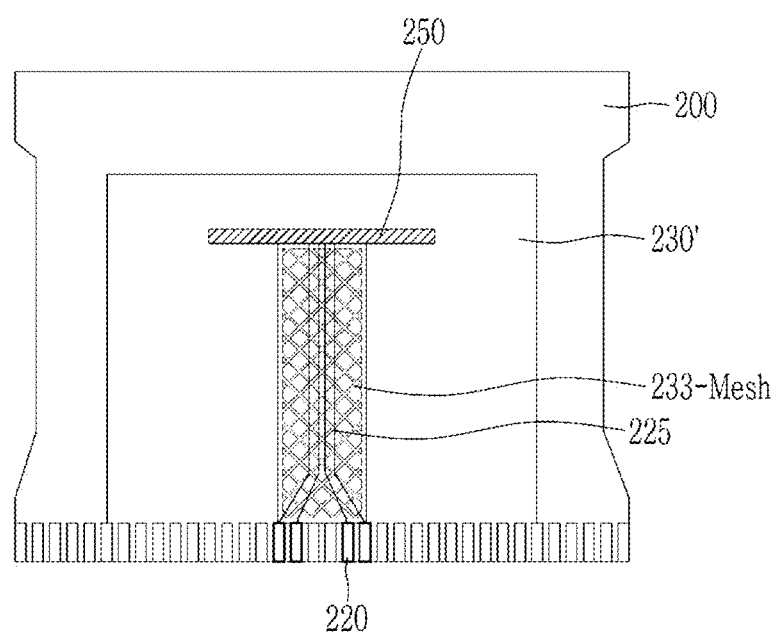
Figure 25:
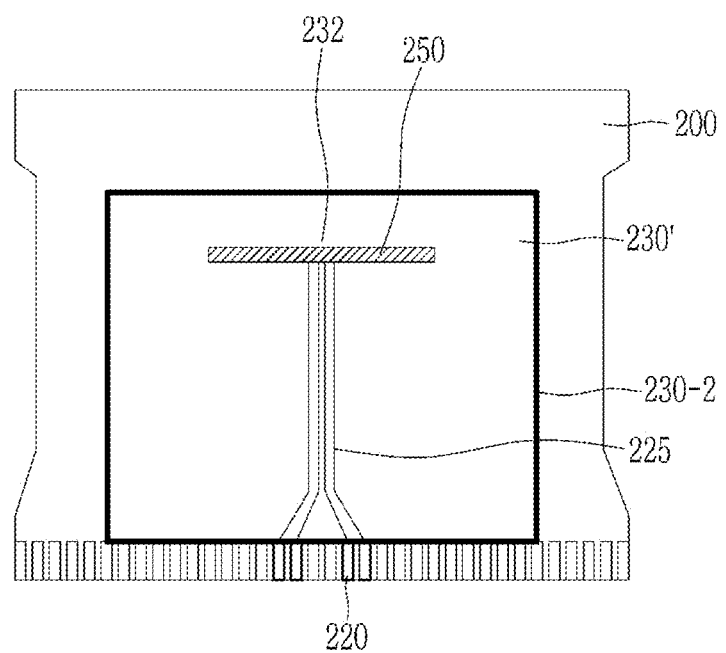

Among them, FIG. 17 to FIG. 19 show exemplary variations based on the structure of FIG. 10, FIG. 20 to FIG. 22 show T-shaped exemplary embodiments, and FIG. 23 to FIG. 25 show plate exemplary embodiments.

First, how the variation of FIG. 13 to FIG. 16 is applied for the exemplary embodiment shown in FIG. 2 to FIG. 4 is described with reference to FIG. 17 to FIG. 19.

FIG. 17 shows the structure of the metal tape 230 corresponding to the structure of FIG. 2. The structure such as FIG. 2 and FIG. 17 is an exemplary embodiment in which the adhesion part 231 helps the role of the heat discharge part 232 such that the characteristic of the heat discharge is improved. As a result, this is an exemplary embodiment that may be used when the need for heat discharge is large.

Unlike FIG. 17, in an exemplary embodiment, the end of the wiring overlapping part 233 may be separated from one side of the input side pad 220 or overlap the input side pad 220. Also, the width of the wiring overlapping part 233 may have the minimum width overlapping only the input side wiring 225. Also, the exemplary embodiment of FIG. 17 does not include the part where the wiring overlapping part 233 and the output side wiring are overlapped and only the heat discharge part 232 is disposed to minimally overlap the output side wiring. As a result, the problem that the signal transmitted to the display panel 100 is delayed by the parasitic capacitance does not occur.

An exemplary embodiment in which the mesh structure is further added to the exemplary embodiment of FIG. 17 is shown in FIG. 18.

The mesh pattern is disposed only in the wiring overlapping part among the metal tape 230.

Meanwhile, if it is modified to further include the adhesive layer 230-2 in the exemplary embodiment of 17, it becomes the exemplary embodiment shown in FIG. 19. In FIG. 19, the wiring overlapping part 233 is shown by the thicker line to show the adhesive layer 230-2 in a plan view, and the adhesive layer 230-2 is marked on the corresponding thick line.

Hereinafter, the T-shaped exemplary embodiment and its exemplary variations are described with reference to FIG. 20 to FIG. 22.

Figure 20:
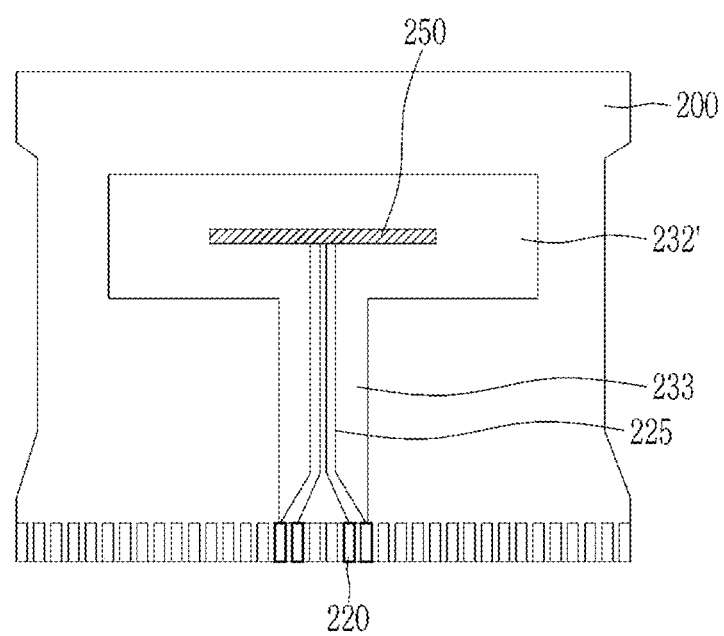

FIG. 20 shows the T-shape exemplary embodiment, and in this structure, unlike FIG. 2, the heat discharge part 232 and the adhesion part 231 are formed without the width difference, thereby configuring a heat discharge part 232'. Because the area of the metal tape is large, the heat of the data driver 250 may be discharged more easily, and it may be used when more heat discharge is needed than in the exemplary embodiment of FIG. 2. However, the exemplary embodiment of FIG. 20 may include the heat discharge part 232 shown in FIG. 2 and FIG. 17, and the adhesion part 231 may be formed narrowly like the width of the heat discharge part 232 of FIG. 2 and FIG. 17. This case has the effect of preventing the signal delay by reducing the parasitic capacitance caused with the output side wiring instead of letting the heat dissipate in a minimal area. The impedance matching with the input side wiring 225 may be adjusted by the size of the wiring overlapping part 233.

In an exemplary embodiment, the end of the wiring overlapping part 233, unlike FIG. 2, may be separated from one side of the input side pad 220 or overlap the input side pad 220. Also, the width of the wiring overlapping part 233 may also have the minimum width overlapping only the input side wiring 225. Further, the exemplary embodiment of FIG. 20 does not include the part where the wiring overlapping part 233 and the output side wiring are overlapped, and only the heat discharge part 232 is disposed to overlap the output side wiring. There is also a possibility that the signal transmitted to the display panel 100 is delayed due to the occurrence of the parasitic capacitance due to the overlap of the heat discharge part 232 and the output side wiring. However, according to an exemplary embodiment, the structure of the heat discharge part 232 may be changed to implement the heat discharge without the delay.

An exemplary embodiment in which the mesh structure is further added to the exemplary embodiment of FIG. 20 is shown in FIG. 21.

Among the metal tape, the mesh pattern is disposed only on the wiring overlapping part.

On the other hand, the exemplary embodiment of FIG. 20 is modified to further include the adhesive layer 230-2 to become an exemplary embodiment shown in FIG. 22. FIG. 22 also shows the wiring overlapping part 233 with the thicker line to show the adhesive layer 230-2 in a plan view, and the adhesive layer 230-2 is marked on the corresponding thick line.

Hereinafter, an exemplary embodiment of a plate type and exemplary variations thereof are described with reference to FIG. 23 to FIG. 25.

As shown in FIG. 23, a metal tape 230' has a quadrangle shape and respectively has the adhesion part, the heat discharge part, and the wiring overlapping part, but has the structure that is difficult to structurally distinguish. In the exemplary embodiment of FIG. 23, the heat discharge part may include the periphery part based on the part overlapping the data driver 250, and the wiring overlapping part may include the periphery part based on the part overlapping the input side wiring 225. Also, the adhesion part may include the part corresponding to the heat discharge part and the wiring overlapping part, and may include the part that is directly attached to the metal tape 230' and the first flexible printed circuit board 200.

In an exemplary embodiment, the end of the wiring overlapping part 233, unlike FIG. 23, may be separated from one side of the input side pad 220 or overlap the input side pad 220. Also, the metal tape 230' overlaps the output side wiring such that the signal transmitted to the display panel 100 may be delayed due the occurrence of the parasitic capacitance. However, the heat discharge may be realized without the delay by changing the structure of the heat discharge part 232.

An exemplary embodiment in which the mesh structure is added to the exemplary embodiment of FIG. 23 is shown in FIG. 24. As shown in FIG. 24, the wiring overlapping metal layer 233-Mesh having the mesh pattern is disposed only at the part overlapping the input side wiring 225 among the metal tape 230'. This is to adjust the degree of overlapping of the input side wiring 225 to control the parasitic capacitance.

On the other hand, an exemplary embodiment of FIG. 25 is provided by modifying the exemplary embodiment of FIG. 23 to further include the adhesive layer 230-2. In FIG. 25, the wiring overlapping part 233 is shown with the thicker line to show the adhesive layer 230-2 in a plan view, and the adhesive layer 230-2 is marked on the corresponding thick line.

In addition to the variant exemplary embodiment shown above, various additional variant exemplary embodiments are possible. That is, in the exemplary embodiments described above, all are illustrated based on the quadrangle structures, but the structure may be modified based on a circle or polygon. In addition, the size and length of the wiring overlapping part 233 may be varied, and the shape of the mesh may also be varied. The wiring overlapping part 233 and the mesh may be changed so as to reduce the impedance difference or to be matched through the parasitic capacitance with the input side wiring 225.

While this disclosure has been described in connection with what is presently considered to be practical exemplary embodiments, it is to be understood that the invention is not limited to the disclosed embodiments. On the contrary, it is

| \<Description of symbols\> | |
|---|---|
| 100: display panel | 110: display area |
| 200, 310, 410: flexible printed circuit board | |
| 300, 400: printed circuit board (PCB) | |
| 250: data driver | 450: timing controller |
| 220: input side pad | 225: input side wiring |
| 320: pad | 325: high-speed driving wiring |
| 230, 230': metal tape | 231: adhesion part |
| 232, 232': heat discharge part | |
| 233, 233-Mesh: wiring overlapping part | |
| 230-2: adhesive layer | 230-M: metal layer |
| 230-1: reinforcement layer | 230-3: release layer |
| 231-M: adhesion metal layer | 232-M: heat discharge metal layer |
| 233-M: wiring overlapping metal layer | 211: film layer |
| 212: insulating layer | 213: adhesive layer |
| 311, 411: input terminal | 312, 412: output terminal |
| 313, 413: wiring part | |

What is claimed is:

1. A display device comprising:
a display panel;
a data driver which transmits a data voltage to the display panel;
a first flexible printed circuit board attached to the display panel and including an input side wiring electrically connected to the data driver and an insulating layer covering the input side wiring;
a first printed circuit board (PCB) electrically connected to the input side wiring to transmit a high-speed driving signal to the data driver;
a metal tape overlapping the input side wiring in a plan view and attached on the first flexible printed circuit board; and
an adhesive layer disposed between the metal tape and the insulating layer of the first flexible printed circuit board.

2. The display device of claim 1, wherein
a wiring overlapping part of the metal tape extends from the data driver toward an input side pad disposed at an end of the input side wiring.

3. The display device of claim 2, wherein
the metal tape further includes a heat discharge part covering the data driver.

4. The display device of claim 3, wherein
the heat discharge part is disposed in an extending direction of the data driver,
the wiring overlapping part is disposed in a direction perpendicular to the extending direction of the data driver, and
the extending direction and the direction perpendicular to the extending direction define a major surface plane defining the metal tape in the plan view.

5. The display device of claim 4, wherein
the adhesive layer is disposed on an entire surface of the metal tape.

6. The display device of claim 4, wherein
the metal tape further includes an adhesion part which helps attachment on the first flexible printed circuit board.

7. The display device of claim 6, wherein
a width of the heat discharge part and a width of the adhesion part are different from each other.

8. The display device of claim 6, wherein
a width of the heat discharge part and a width of the adhesion part are the same.

9. The display device of claim 4, wherein
the wiring overlapping part is separated from the input side pad disposed at the end of the input side wiring by a predetermined distance in the plan view.

10. The display device of claim 4, wherein
the wiring overlapping part is in contact with the input side pad disposed at the end of the input side wiring in the plan view.

11. The display device of claim 4, wherein
the heat discharge part and the wiring overlapping part are separated with a predetermined interval, and the separated heat discharge part and wiring overlapping part are connected to each other by an adhesive contained in the metal tape.

12. The display device of claim 4, wherein
the wiring overlapping part defines a plurality of openings and includes a linear structure disposed along an outer periphery of the wiring overlapping part.

13. The display device of claim 1, wherein
the metal tape has a plate structure.

14. The display device of claim 1, wherein
a part of the metal tape overlapping the input side wiring in the plan view defines an opening, and
the opening is defined in a wiring overlapping part of the metal tape where the metal tape overlaps the input side wiring.

15. The display device of claim 14, wherein
the opening comprises a plurality of openings, and the wiring overlapping part further includes a linear structure disposed along an outer periphery of the wiring overlapping part.

16. A display device comprising:
a display panel;
a data driver which transmits a data voltage to the display panel;
a first flexible printed circuit board attached to the display panel and including an input side wiring electrically connected to the data driver;
a first printed circuit board (PCB) electrically connected to the input side wiring to transmit a high-speed driving signal to the data driver; and
a metal tape overlapping the input side wiring in a plan view and attached on the first flexible printed circuit board,
wherein a part of the metal tape overlapping the input side wiring in the plan view defines a plurality of openings, and
wherein some of the plurality of openings overlap a part of the input side wiring, and the others of the plurality of openings does not overlap the input side wiring.

17. The display device of claim 16, wherein
the metal tape further includes a heat discharge part covering the data driver.

18. The display device of claim 17, wherein
the heat discharge part is disposed in an extending direction of the data driver,
a wiring overlapping part of the metal tape is disposed in a direction perpendicular to the extending direction of the data driver, and the extending direction and the direction perpendicular to the extending direction define a major surface plane defining the metal tape in the plan view.

19. The display device of claim 18, wherein the metal tape further includes an adhesion part which helps attachment on the first flexible printed circuit board.

20. The display device of claim 18, wherein the heat discharge part and the wiring overlapping part are separated with a predetermined interval, and the separated heat discharge part and wiring overlapping part are connected to each other by an adhesive contained in the metal tape.

* * * * *